United States Patent
Cheng et al.

(10) Patent No.: US 12,228,619 B2
(45) Date of Patent: Feb. 18, 2025

(54) THROUGH SILICON VIA DETECTION CIRCUIT AND METHOD

(71) Applicant: CHANGXIN MEMORY TECHNOLOGIES, INC., Hefei (CN)

(72) Inventors: Weijie Cheng, Hefei (CN); Onegyun Na, Hefei (CN)

(73) Assignee: CHANGXIN MEMORY TECHNOLOGIES, INV, Hefei (CN)

( * ) Notice: Subject to any disclaimer, the term of this patent is extended or adjusted under 35 U.S.C. 154(b) by 156 days.

(21) Appl. No.: 17/823,583

(22) Filed: Aug. 31, 2022

(65) Prior Publication Data

US 2023/0280416 A1    Sep. 7, 2023

Related U.S. Application Data

(63) Continuation of application No. PCT/CN2022/094516, filed on May 23, 2022.

(30) Foreign Application Priority Data

Mar. 2, 2022    (CN) .......................... 202210201963.2

(51) Int. Cl.
| | | |
|---|---|---|
| *G01R 31/66* | (2020.01) | |
| *G01R 27/14* | (2006.01) | |
| *G01R 31/52* | (2020.01) | |

(52) U.S. Cl.
CPC ............. *G01R 31/66* (2020.01); *G01R 27/14* (2013.01); *G01R 31/52* (2020.01)

(58) Field of Classification Search
CPC ........ G01R 31/66; G01R 31/67; G01R 31/70; G01R 31/71; G01R 31/52; G01R 31/54; G01R 31/2853; G01R 27/14
See application file for complete search history.

(56) References Cited

U.S. PATENT DOCUMENTS

| 10,205,090 B2 | 2/2019 | Lee |
|---|---|---|
| 10,985,211 B1 | 4/2021 | Lee |

(Continued)

FOREIGN PATENT DOCUMENTS

| CN | 102479789 A | 5/2012 |
|---|---|---|
| CN | 105405785 A | 3/2016 |

(Continued)

OTHER PUBLICATIONS

Fang Xu, et al. "Pre-bond TSV test method using custom pad", Chinese Journal of Scientific Instrument, vol. 39, No. 5 May 2018.

*Primary Examiner* — Lee E Rodak
*Assistant Examiner* — Demetrius R Pretlow
(74) *Attorney, Agent, or Firm* — Syncoda LLC; Feng Ma

(57) ABSTRACT

A circuit for through silicon via (TSV) detection includes a TSV to be tested, an equivalent adjustable resistor and a reverse output circuit. A first terminal of the TSV to be tested is connected to a second terminal of the equivalent adjustable resistor, and a second terminal of the TSV to be tested is grounded. An input terminal of the reverse output circuit is connected to the first terminal of the TSV to be tested. The method includes: adjusting a resistance value of the equivalent adjustable resistor to a preset first resistance value, and keeping a voltage of a first terminal of the equivalent adjustable resistor at a preset voltage value, the first resistance value is a maximum resistance value of an equivalent resistor corresponding to the TSV to be tested when the TSV to be tested is normal.

17 Claims, 5 Drawing Sheets

(56) References Cited

U.S. PATENT DOCUMENTS

| | | |
|---|---|---|
| 11,114,444 B2 | 9/2021 | Tsai |
| 2007/0246787 A1 | 10/2007 | Wang |
| 2010/0153043 A1* | 6/2010 | Su .......................... H01L 22/34 |
| | | 702/71 |
| 2011/0093224 A1 | 4/2011 | Ide |
| 2013/0006557 A1* | 1/2013 | Chakrabarty .. G01R 31/318541 |
| | | 702/65 |
| 2017/0269150 A1 | 9/2017 | Kang et al. |
| 2020/0096558 A1* | 3/2020 | Ide ..................... H01L 25/0657 |
| 2020/0373308 A1 | 11/2020 | Tsai |
| 2021/0143214 A1 | 5/2021 | Lee et al. |
| 2021/0215755 A1 | 7/2021 | Lin |
| 2021/0217861 A1 | 7/2021 | Song et al. |
| 2023/0070785 A1* | 3/2023 | Lee ..................... H01L 25/0657 |
| 2023/0102669 A1* | 3/2023 | Gong .................. H01L 23/481 |
| | | 365/225.7 |

FOREIGN PATENT DOCUMENTS

| | | |
|---|---|---|
| CN | 106199382 A | 12/2016 |
| CN | 206057425 U | 3/2017 |
| CN | 106771985 A | 5/2017 |
| CN | 103681865 B | 3/2018 |
| CN | 111323694 A | 6/2020 |
| CN | 111987071 A | 11/2020 |
| CN | 112068011 A | 12/2020 |
| CN | 112151377 A | 12/2020 |
| CN | 112786562 A | 5/2021 |
| CN | 113113488 A | 7/2021 |
| EP | 2541415 A1 | 1/2013 |

\* cited by examiner

THROUGH SILICON VIA DETECTION CIRCUIT AND METHOD

CROSS-REFERENCE TO RELATED APPLICATIONS

This application is a continuation of International Application No. PCT/CN2022/094516 filed on May 23, 2022, which claims priority to Chinese Patent Application No. 202210201963.2 filed on Mar. 2, 2022. The disclosures of the above-referenced applications are hereby incorporated by reference in their entirety.

BACKGROUND

TSV technology is a key technology for realizing three-dimensional interconnection in an integrated circuit. In this technology, a TSV structure may be used to stack bare chips or multi-chip modules, which greatly reduces the package volume of the integrated circuits.

At present, the TSV production process is still in the research and development stage, and the manufacture process is not mature enough. The electroplating process at deep sub-micron level cannot completely guarantee the complete filling of metal copper, and the filled copper pillars may have voids. However, the voids will lead to a decrease of the conductivity and an open circuit or a fully open circuit state, thereby affecting the overall yield of a semiconductor device packaged with a TSV.

Therefore, how to effectively detect whether the TSV is defective has become an urgent technical problem to be solved.

SUMMARY

Embodiments of the disclosure relate to the technical field of detection circuits, and provide a circuit and method for TSV detection, which can effectively detect whether a TSV is defective.

In a first aspect, a method for TSV detection is provided, the method is applied to a circuit for TSV detection, where the circuit for TSV detection includes a TSV to be tested, an equivalent adjustable resistor, and a reverse output circuit.

A first terminal of the TSV to be tested is connected to a second terminal of the equivalent adjustable resistor, and a second terminal of the TSV to be tested is grounded; where an input terminal of the reverse output circuit is connected to the first terminal of the TSV to be tested.

The method includes following operations.

A resistance value of the equivalent adjustable resistor is adjusted to a preset first resistance value, and a voltage of a first terminal of the equivalent adjustable resistor is kept at a preset voltage value, where the first resistance value is a maximum resistance value of an equivalent resistor corresponding to the TSV to be tested when being normal.

It is determined whether the TSV to be tested is defective based on a signal output by an output terminal of the reverse output circuit, where when a voltage of the first terminal of the TSV to be tested is greater than half of the preset voltage value, the output terminal of the reverse output circuit outputs a low level signal, and when the voltage of the first terminal of the TSV to be tested is less than half of the preset voltage value, the output terminal of the reverse output circuit outputs a high level signal.

In a second aspect, a circuit for TSV detection is provided, the circuit includes a TSV to be tested, an equivalent adjustable resistor, and a reverse output circuit.

In the circuit, a first terminal of the TSV to be tested is connected to a second terminal of the equivalent adjustable resistor, and a second terminal of the TSV to be tested is grounded; where an input terminal of the reverse output circuit is connected to the first terminal of the TSV to be tested.

The equivalent adjustable resistor is used for voltage division, a lower limit value of a resistance value of the equivalent adjustable resistor is less than a third resistance value, and an upper limit value of the resistance value of the equivalent adjustable resistor is greater than a fourth resistance value; where the third resistance value is a minimum resistance value of an equivalent resistor corresponding to the TSV to be tested when the TSV to be tested is normal, and the fourth resistance value is a maximum resistance value of the equivalent resistor corresponding to the TSV to be tested when the TSV to be tested is normal.

The reverse output circuit is used for outputting a low level signal or a high level signal based on a voltage of the first terminal of the TSV to be tested.

DETAILED DESCRIPTION

Figure 1:
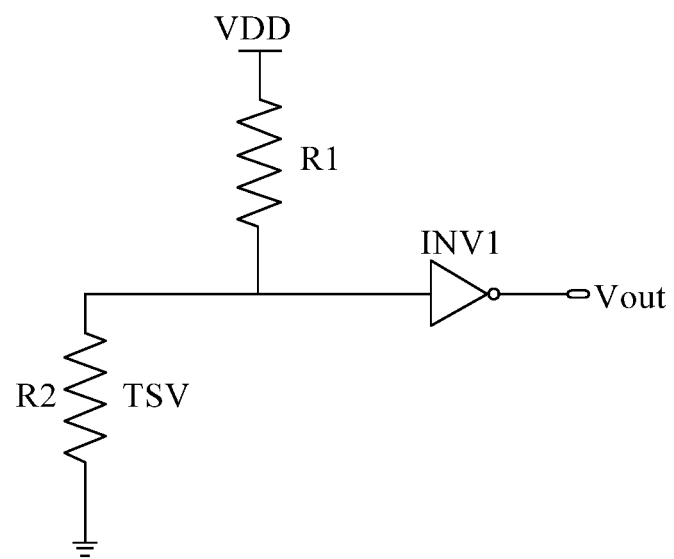
FIG. 1 is a first schematic structural diagram of a circuit for TSV detection according to embodiments of the disclosure.

In order to make the objectives, the technical solutions and the advantages of embodiments of the disclosure clearer, the technical solutions in the embodiments of the disclosure will be clearly and completely described below in conjunction with the accompanying drawings in the embodiments of the disclosure. It will be apparent that the described embodiments are part of, but not all of, the embodiments of the disclosure. Based on the embodiments in the disclosure, all other embodiments obtained by persons of ordinary skill in the art without creative work shall fall within the scope of protection of the disclosure. In addition, although the contents disclosed in the disclosure are presented in one or more examples, it should be understood that aspects of the disclosure can also individually constitute a complete implementation.

It should be noted that the brief description of the terms in the disclosure is merely for the ease of understanding of the implementations below, but is not intended to limit the implementations of the disclosure. These terms should be understood in terms of their normal and ordinary meanings, unless otherwise indicated.

The terms "first", "second" or the like in the description, claims and the above drawings of the disclosure are used to distinguish similar or like objects or entities, and are not necessarily meant to define a specific sequence or order, unless otherwise stated. It should be understood that the terms so used may be exchanged where appropriate, and for example, the terms can be implemented in sequences other than those illustrated or described according to the embodiments of the disclosure described.

In addition, the terms "comprise" and "has/have" and any variations thereof are intended to include by covering, but not exclusively. For example, products or devices including a series of components are not necessarily limited to those listed clearly, but may include other components not clearly listed or inherent to such products or devices.

The term "module" used in the disclosure refers to any known or later developed hardware, software, firmware, artificial intelligence, fuzzy logic, or a combination of hardware and/or software code, and is capable of implementing functions related to the element.

The TSV technology is the latest technology to realize interconnection between chips by making vertical conduction between chips and between wafers. Different from previous integrated circuit (IC) packaging and bonding and stacking technology using bumps, the TSV technology can maximize the density and minimize the overall dimension of chips stacked in a three-dimensional direction, and greatly improve the performance of chip speed and low power consumption.

At present, the TSV production process is still in the research and development stage, and the manufacture process is not mature enough. The electroplating process at the deep sub-micron level cannot completely guarantee the complete filling of metal copper, and the filled copper pillars may have voids. However, the voids will lead to a decrease of the conductivity and an open circuit or a fully open circuit state, thereby affecting the overall yield of a semiconductor device packaged with a TSV.

To solve the technical problem above, the disclosure provides a circuit and method for TSV detection. By establishing a voltage division detection circuit, it can be accurately determined whether a TSV to be tested is defective. In particular, in the circuit and method for TSV detection according to embodiments of the disclosure, the equivalent resistor of the TSV to be tested and the equivalent adjustable resistor constitute a voltage division circuit. Therefore, by comparing whether the voltage of the first terminal of the TSV to be tested is greater than half of the preset voltage value, it can be determined whether a resistance value of the equivalent resistor of the TSV to be tested is greater than a resistance value of the equivalent adjustable resistor. In addition, the resistance value of the equivalent adjustable resistor is a maximum resistance value of the equivalent resistor corresponding to the TSV to be tested when the TSV to be tested is normal. Therefore, it can be determined whether the TSV to be tested is defective based on whether the resistance value of the equivalent resistor of the TSV to be tested is greater than the resistance value of the equivalent adjustable resistor. Detailed description is made below with detailed embodiments.

With reference to FIG. 1, FIG. 1 is a first schematic structural diagram of a circuit for TSV detection according to embodiments of the disclosure. As shown in FIG. 1, the circuit for TSV detection according to embodiments of the disclosure includes: a TSV to be tested, an equivalent adjustable resistor R1, and a reverse output circuit INV1.

The TSV to be tested is equivalent to a resistor R2.

A first terminal of the TSV to be tested is connected to a second terminal of the equivalent adjustable resistor R1, and a second terminal of the TSV to be tested is grounded. An input terminal of the reverse output circuit INV1 is connected to the first terminal of the TSV to be tested.

It can be understood that the equivalent resistor R2 of the TSV to be tested and the equivalent adjustable resistor R1 constitute a voltage division circuit.

Figure 2:
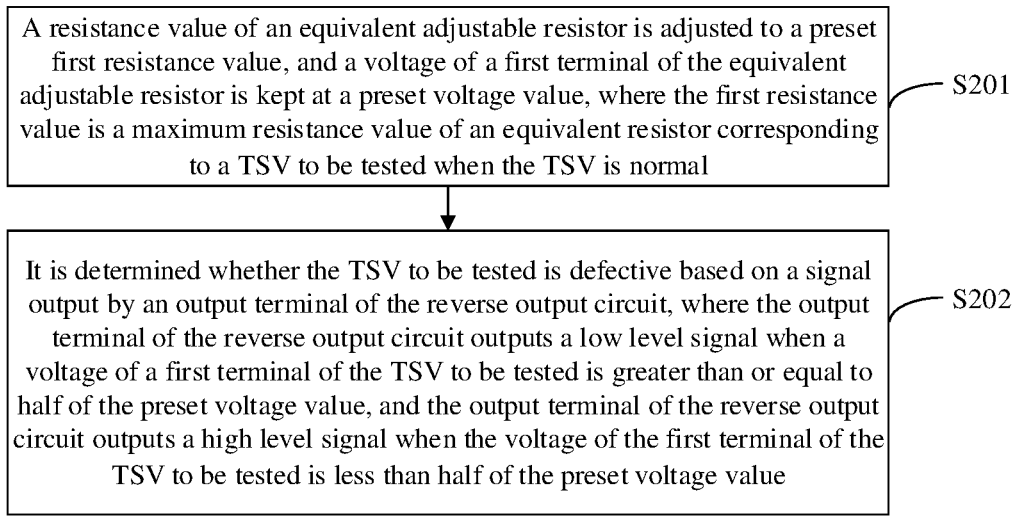
FIG. 2 is a first schematic flowchart of a method for TSV detection according to embodiments of the disclosure.

With reference to FIG. 2, FIG. 2 is a first schematic flowchart of a method for TSV detection according to embodiments of the disclosure. In a feasible implementation, the method for TSV detection includes the following operations.

At S201, a resistance value of the equivalent adjustable resistor is adjusted to a preset first resistance value, and a voltage of a first terminal of the equivalent adjustable resistor is kept at a preset voltage value.

The first resistance value is a maximum resistance value of the equivalent resistor R2 corresponding to the TSV to be tested when the TSV to be tested is normal. In a feasible implementation, a maximum resistance value and a minimum resistance value of an equivalent resistor of a same type of TSVs when being normal can be measured in advance.

The first resistance value is less than a resistance value of the TSV to be tested when being open-circuited.

At S202, it is determined whether the TSV to be tested is defective based on a signal output by an output terminal Vout of the reverse output circuit INV1.

In a feasible implementation, when testing a TSV, the voltage of the first terminal of the equivalent adjustable resistor R1 is kept at the preset voltage value VDD, and then the signal output by the output terminal Vout of the reverse output circuit INV1 is tested, and it is determined whether the TSV to be tested is defective based on the signal output by the output terminal Vout of the reverse output circuit INV1.

The reverse output circuit INV1 can be pre-configured. When the voltage of the first terminal of the TSV to be tested is greater than half of the preset voltage value VDD, the output end Vout of the reverse output circuit INV1 outputs a low level signal, and when the voltage of the first terminal of the TSV to be tested is less than half of the preset voltage value VDD, the output end Vout of the reverse output circuit INV1 outputs a high level signal.

It can be understood that the equivalent resistor R2 of the TSV to be tested and the equivalent adjustable resistor R1 constitute a voltage division circuit. Therefore, by comparing whether the voltage of the first terminal of the TSV to be tested is greater than half of the preset voltage value VDD, it can be determined whether a resistance value of the equivalent resistor R2 is greater than a resistance value of the equivalent adjustable resistor R1. In addition, the resistance value of the equivalent adjustable resistor R1 is a maximum resistance value of the equivalent resistor R2 corresponding to the TSV to be tested when the TSV to be tested is normal. Therefore, based on whether the resistance value of the equivalent resistor R2 of the TSV to be tested is greater than the resistance value of the equivalent adjustable resistor R1, it can be determined whether the TSV to be tested is open-circuited.

In some embodiments, when the output terminal Vout of the reverse output circuit INV1 outputs a low level signal, it indicates that the resistance value of the equivalent resistor R2 corresponding to the TSV to be tested is greater than the maximum resistance value of the equivalent resistor R2 corresponding to the TSV to be tested when the TSV to be tested is normal, therefore, it can be determined that the TSV to be tested is open-circuited. When the output terminal Vout of the reverse output circuit INV1 outputs a high level signal, it indicates that the resistance value of the equivalent resistor R2 corresponding to the TSV to be tested is less than the maximum resistance value of the equivalent resistor R2 corresponding to the TSV to be tested when the TSV to be tested is normal, therefore, it can be determined that the TSV to be tested is normal or short-circuited.

In the circuit and method for TSV detection according to embodiments of the disclosure, the equivalent resistor R2 of the TSV to be tested and the equivalent adjustable resistor R1 constitute a voltage division circuit. By comparing whether the voltage of the first terminal of the TSV to be tested is greater than half of the preset voltage value, it can be determined whether the resistance value of the equivalent resistor R2 of the TSV to be tested is greater than the resistance value of the equivalent adjustable resistor R1. Since the resistance value of the equivalent adjustable resistor R1 is a maximum resistance value of the equivalent resistor R2 of the TSV to be tested when the TSV to be tested is normal, it can be accurately determined whether the TSV to be tested is open-circuited based on whether the resistance value of the equivalent resistor R2 of the TSV to be tested is greater than the resistance value of the equivalent adjustable resistor R1.

In some embodiments, after the resistance value of the equivalent adjustable resistor R1 is adjusted to the first resistance value, and when the output terminal Vout of the reverse output circuit INV1 outputs a high level signal, it indicates that the resistance value of the equivalent resistor R2 corresponding to the TSV to be tested is less than the maximum resistance value of the equivalent resistor R2 corresponding to the TSV to be tested when the TSV to be tested is normal. Therefore, it can be determined that the TSV to be tested is normal or open-circuited.

In some embodiments, after it is determined that the TSV to be tested is normal or open-circuited, the resistance value of the equivalent adjustable resistor R1 is further adjusted to a preset second resistance value. The second resistance value is a minimum resistance value of the equivalent resistor R2 of the TSV to be tested when the TSV to be tested is normal.

In some embodiments, the second resistance value is greater than the resistance value of the equivalent resistor of the TSV to be tested when the TSV to be tested is open-circuited.

When the output terminal Vout of the reverse output circuit INV1 outputs a low level signal after the resistance value of the equivalent adjustable resistor R1 is adjusted to the second resistance value, it indicates that the TSV to be tested is normal. When the output terminal Vout of the reverse output circuit INV1 outputs a high level signal after the resistance value of the equivalent adjustable resistor R1 is adjusted to the second resistance value, it indicates that the TSV to be tested is open-circuited.

It can be understood that, when the output terminal Vout of the reverse output circuit INV1 outputs a low level signal after the resistance value of the equivalent adjustable resistor R1 is adjusted to the second resistance value, it indicates that the resistance value of the equivalent resistor R2 of the TSV to be tested is greater than the minimum resistance value of the equivalent resistor R2 of the TSV to be tested when TSV to be tested is normal, therefore, it can be determined that the TSV to be tested is normal. When the output terminal Vout of the reverse output circuit INV1 outputs a high level signal after the resistance value of the equivalent adjustable resistor R1 is adjusted to the second resistance value, it indicates that the resistance value of the equivalent resistor R2 of the TSV to be tested is less than the minimum resistance value of the equivalent resistor R2 of the TSV to be tested when the TSV to be tested is normal, therefore, it can be determined that the TSV to be tested is open-circuited.

Figure 3:
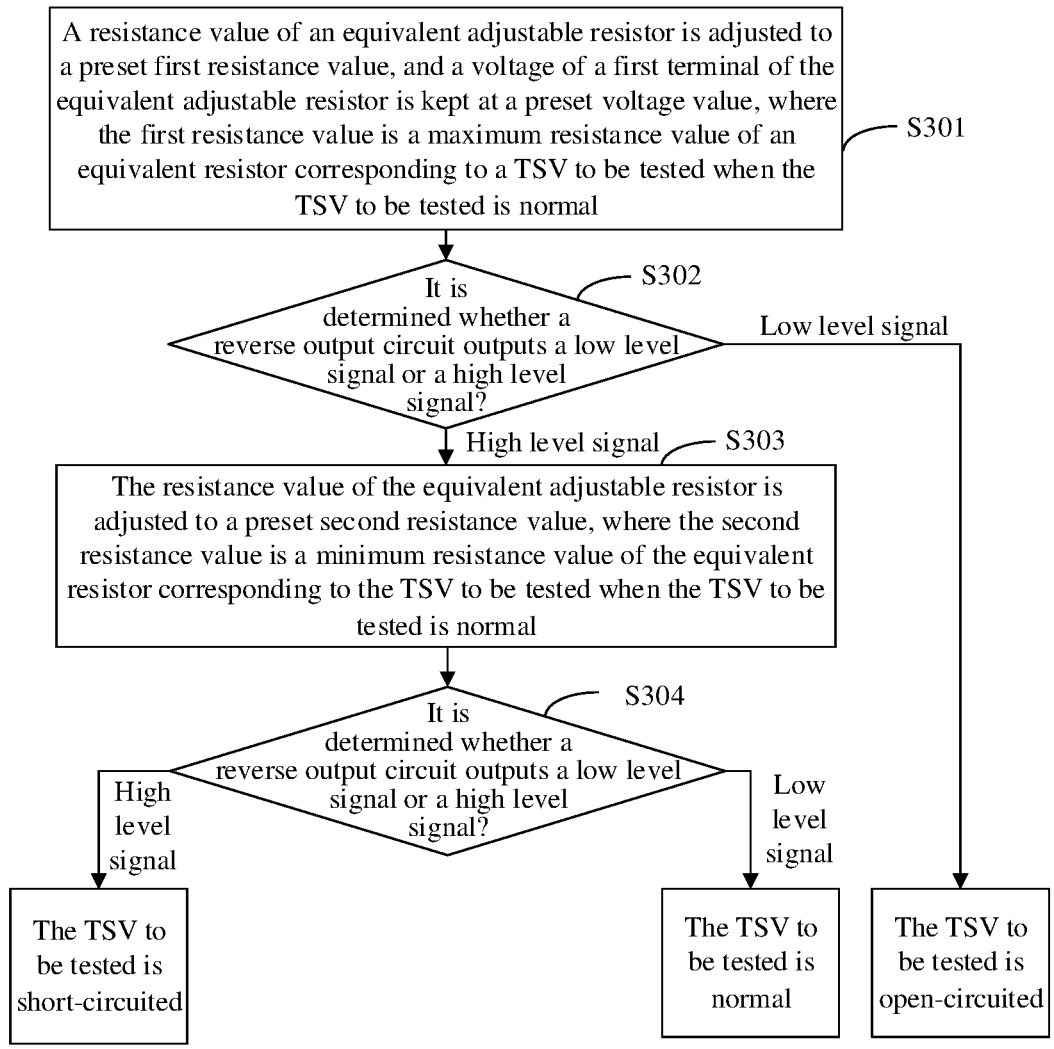
FIG. 3 is a second schematic flowchart of a method for TSV detection according to embodiments of the disclosure.

To better understand embodiments of the disclosure, with reference to FIG. 3, FIG. 3 is a second schematic flowchart of a method for TSV detection according to embodiments of the disclosure. In a feasible implementation, the method for TSV detection includes the following operations.

At S301, a resistance value of an equivalent adjustable resistor is adjusted to a preset first resistance value, and a voltage of a first terminal of the equivalent adjustable resistor is kept at a preset voltage value.

The first resistance value is a maximum resistance value of the equivalent resistor corresponding to the TSV to be tested when TSV to be tested is normal.

At S302, a signal output by an output terminal of a reverse output circuit is obtained; when the reverse output circuit outputs a high level signal, continue with S303; when the reverse output circuit outputs a low level signal, it is determined that the TSV to be tested is open-circuited.

At S303, the resistance value of the equivalent adjustable resistor is adjusted to a preset second resistance value. The second resistance value is a minimum resistance value of the equivalent resistor corresponding to the TSV to be tested when the TSV to be tested is normal.

At S304, a signal output by the output terminal of the reverse output circuit is obtained; when the reverse output circuit outputs a high level signal, it is determined that the TSV to be tested is short-circuited; when the reverse output circuit outputs a low level signal, it is determined that the TSV to be tested is normal.

In the circuit for TSV detection and method according to embodiments of the disclosure, a voltage division circuit is formed by using the equivalent resistor of the TSV to be tested and the equivalent adjustable resistor. During testing, a voltage of a terminal of the equivalent adjustable resistor is kept at a preset voltage value, the resistance value of the equivalent adjustable resistor is adjusted to a maximum resistance value or a minimum resistance value of the equivalent resistor corresponding to the TSV to be tested when the TSV to be tested is normal, and then based on the signal output by the output terminal of the reverse output circuit, it can be accurately determined whether the TSV to be tested is normal or is open-circuited or short-circuited.

It can be understood that the flowchart illustrated in FIG. 3 is merely a schematic diagram, and does not aim at limiting the sequence of operations in embodiments of the disclosure. For example, the resistance value of the equivalent adjustable resistor is adjusted to the maximum resistance value of the equivalent resistor corresponding to the TSV to be tested when the TSV to be tested is normal, so as to determine whether the TSV to be tested is open-circuited, and then the resistance value of the equivalent adjustable resistor is adjusted to the minimum resistance value of the equivalent resistor corresponding to the TSV to be tested when the TSV to be tested is normal, so as to determine whether the TSV to be tested is short-circuited. Alternatively, the resistance value of the equivalent adjustable resistor is adjusted to the minimum resistance value of the equivalent resistor corresponding to the TSV to be tested when the TSV to be tested is normal, so as to determine whether the TSV to be tested is short-circuited, and then the resistance value of the equivalent adjustable resistor is adjusted to the maximum resistance value of the equivalent resistor corresponding to the TSV to be tested when the TSV to be tested is normal, so as to determine whether the TSV to be tested is open-circuited.

Figure 4:
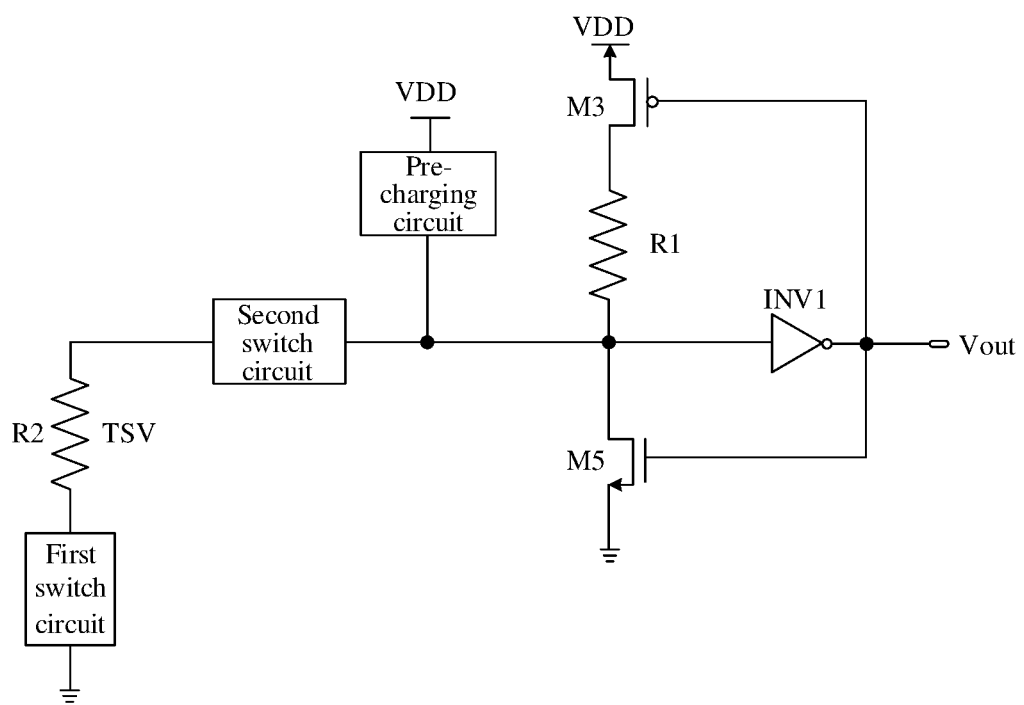
FIG. 4 is a second schematic structural diagram of a circuit for TSV detection according to embodiments of the disclosure.

In some embodiments, with reference to FIG. 4, FIG. 4 is a second schematic structural diagram of a circuit for TSV detection according to embodiments of the disclosure. In a feasible implementation, the TSV detection circuit further includes: a first switch circuit, a second switch circuit, a pre-charging circuit, and a latch circuit.

In some embodiments, a first terminal of the first switch circuit is grounded, and a second terminal of the first switch circuit is connected to a second terminal of the TSV to be tested. A first terminal of the second switch circuit is connected to a first terminal of the TSV to be tested, and a second terminal of the second switch circuit is connected to a second terminal of the equivalent adjustable resistor R1.

In some embodiments, in a non-testing state, the first switch circuit and the second switch circuit are in open-circuited state, and the TSV is connected to a normal working circuit. During the test, after a voltage of a first terminal of the equivalent adjustable resistor R1 is kept at a preset voltage value, the first switch circuit and the second switch circuit are turned on.

In some embodiments, the latch circuit is realized by using a positive channel metal oxide semiconductor (PMOS) transistor and a negative channel metal oxide semiconductor (NMOS) transistor, the pre-charging circuit is realized by using a PMOS transistor, and the equivalent adjustable resistor is realized by using a PMOS transistor.

Optionally, the first switch circuit and the second switch circuit are realized using NMOS transistors.

Figure 5:
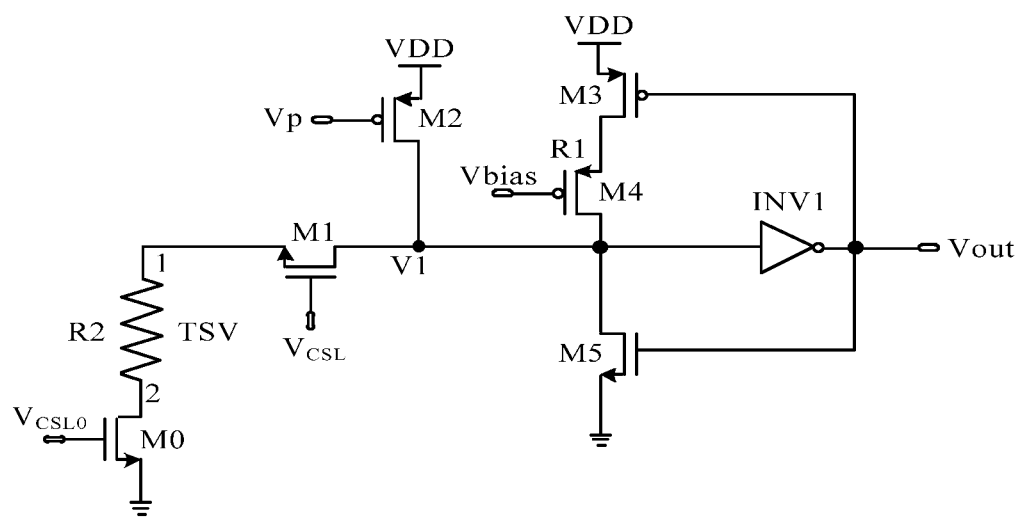
FIG. 5 is a third schematic structural diagram of a circuit for TSV detection according to embodiments of the disclosure.

To better understand embodiments of the disclosure, with reference to FIG. 5, FIG. 5 is a third schematic structural diagram of a circuit for TSV detection according to embodiments of the disclosure. As shown in FIG. 5, in some embodiments, the circuit for TSV detection includes: a first NMOS transistor M0, a TSV to be tested, a second NMOS transistor M1, a third NMOS transistor M5, a second PMOS transistor M2, a first PMOS transistor M3, a third PMOS transistor M4, and a reverse output circuit INV1.

A source of the first NMOS transistor M0 is grounded, a drain of the first NMOS transistor M0 is connected to a second terminal of the TSV to be tested, and a gate of the first NMOS transistor M0 is connected to a control power supply $V_{CSL0}$. In some embodiments, the first NMOS transistor M0 equivalently forms the first switch circuit. The TSV to be tested is equivalent to a resistor R2.

A source of the second NMOS transistor M1 is connected to a first terminal of the TSV to be tested, a drain of the second NMOS transistor M1 is connected to a drain of the third PMOS transistor M4, and a gate of the second NMOS transistor M1 is connected to a control power supply $V_{CSL}$. In some embodiments, the second NMOS transistor M1 equivalently forms the second switch circuit.

During the test, a gate voltage of the first NMOS transistor M0 and a gate voltage of the second NMOS transistor M1 are respectively adjusted to high levels, to turn on the first NMOS transistor M0 and the second NMOS transistor M1.

In some embodiments, the first PMOS transistor M3 and the third NMOS transistor M5 may form the latch circuit.

A source of the first PMOS transistor M3 is connected to a preset power supply VDD, a drain of the first PMOS transistor M3 is connected to a source of the third PMOS transistor M4, and a gate of the first PMOS transistor M3 is connected to an output terminal of the reverse output circuit INV1. A source of the third NMOS transistor M5 is grounded, a drain of the third NMOS transistor M5 is connected to a drain of the third PMOS transistor M4, and a gate of the third NMOS transistor M5 is connected to the output terminal of the reverse output circuit INV1.

In some embodiments, the second PMOS transistor M2 may form the pre-charging circuit. A source of the second PMOS transistor M2 is connected to the preset power supply VDD, a drain of the second PMOS transistor M2 is connected to the drain of the second NMOS transistor M1, and a gate of the second PMOS transistor M2 is provided with a pre-charging control signal Vp.

In some embodiments, the third PMOS transistor M4 forms the equivalent adjustable resistor. A gate of the third PMOS transistor M4 is provided with an adjustable voltage Vbias. In some embodiments, a resistance value of an equivalent resistor R1 of the third PMOS transistor M4 is adjusted by adjusting the adjustable voltage Vbias, and the adjustable voltage Vbias is provided by a voltage adjustable power supply.

To better understand embodiments of the disclosure, in a feasible implementation, it is assumed that the resistance value of the equivalent resistor R1 is adjusted to 12 different resistance values, i.e., r0–r11.

In these resistance values, the magnitude of r0, r1, r2, . . . , and r11 increases in turn, r4 is the minimum resistance value of the equivalent resistor corresponding to the TSV to be tested when the TSV to be tested is normal, and r8 is the maximum resistance value of the equivalent resistor corresponding to the TSV to be tested when the TSV to be tested is normal.

When the circuit for TSV detection is in a non-testing state, $V_{CSL0}$=L (a low level; same below), $V_{CSL}$=L, and Vp=H (a high level; same below). At this time, the TSV is in open-circuited state, the pre-charging circuit is in open-circuited state, and the circuit for TSV detection has no effect.

When the circuit for TSV detection is in a testing state, the method for TSV detection includes the following operations.

At operation 1, Vbias is adjusted, to adjust the resistance value of the equivalent adjustable resistor R1 to r8.

At operation 2, a pre-charging operation is performed, which includes latching an input V1 of a latch circuit consisting of the first PMOS transistor M3 and the third NMOS transistor M5, and pre-charging a voltage V1 of the drain of the second NMOS transistor M1 to the preset voltage value VDD.

When the voltage V1 of the drain of the second NMOS transistor M1 is pre-charged to the preset voltage value VDD, i.e., the input terminal of the reverse output circuit is at a high level, the output terminal of the reverse output circuit is at a low level, and the first PMOS transistor M3 is turned on and the third NMOS transistor M5 is in a non-conducting state. An initial state can be given to the reverse output circuit, the first PMOS transistor M3, and the third NMOS transistor M5 through the pre-charging operation.

At operation 3, a sensing operation is performed, which includes adjusting $V_{CSL0}$ to H and adjusting $V_{CSL}$ to H, i.e., $V_{CSL0}$=H, $V_{CSL}$=H.

After $V_{CSL0}$ is adjusted to H and $V_{CSL}$ is adjusted to H, V1=VDD*(R2/(R1+R2)).

At this time, if V1>VDD/2, the output terminal Vout of the reverse output circuit INV1 outputs a low level signal, i.e., Vout=L, it indicates that R2>r8. In this case, it can be determined that the TSV to be tested is open-circuited.

If V1<VDD/2, the output terminal Vout of the reverse output circuit INV1 outputs a high level signal, i.e., Vout=H, it indicates that R2<r8. In this case, it can be determined that the TSV to be tested is normal or is short-circuited. Continue with operation 4.

At operation 4, Vbias is adjusted, to adjust the resistance value of the equivalent adjustable resistor R1 to r4.

Operations 2 and 3 are repeated.

If V1>VDD/2, the output terminal Vout of the reverse output circuit INV1 outputs a low level signal, i.e., Vout=L, it indicates that R2>r4. In this case, it can be determined that the TSV to be tested is normal.

If V1<VDD/2, the output terminal Vout of the reverse output circuit INV1 outputs a high level signal, i.e., Vout=H, it indicates that R2<r4. In this case, it can be determined that the TSV to be tested is short-circuited.

In the circuit and method for TSV detection according to embodiments of the disclosure, the equivalent resistor of the TSV to be tested and the equivalent adjustable resistor constitute a voltage division circuit. During the test, a voltage of a terminal of the equivalent adjustable resistor is kept at a preset voltage value, the resistance value of the equivalent adjustable resistor is adjusted to a maximum resistance value or a minimum resistance value of the equivalent resistor corresponding to the TSV to be tested when the TSV to be tested is normal, and then it can be accurately determined whether the TSV to be tested is normal or is open-circuited or short-circuited based on the signal output by the output terminal of the reverse output circuit.

In some embodiments, after it is determined that the TSV to be tested is open-circuited, the method for TSV detection further includes the following operations.

The resistance value of the equivalent adjustable resistor is adjusted to at least one preset first sampling resistance value, and a resistance value range of the equivalent resistor corresponding to the TSV to be tested is determined based on the signal output by the output terminal of the reverse output circuit. Each of the at least one first sampling resistance value is greater than the maximum resistance value of the equivalent resistor corresponding to the TSV to be tested when being normal.

In a feasible implementation, still with reference to FIG. 5, it is assumed that the resistance value of the equivalent resistor R1 is adjusted to 12 different resistance values, i.e., r0-r11. In these resistance values, the magnitude of r0, r1, r2, . . . , and r11 increases in turn. r4 is the minimum resistance value of the equivalent resistor corresponding to the TSV to be tested when the TSV to be tested is normal, and r8 is the maximum resistance value of the equivalent resistor corresponding to the TSV to be tested when the TSV to be tested is normal, and the first sampling resistance value may include, for example, r9-r11.

After it is determined that the TSV to be tested is open-circuited, the method for TSV detection further includes the following operations.

At operation 1, Vbias is adjusted, to adjust the resistance value of the equivalent adjustable resistor R1 to r11.

At operation 2, a pre-charging operation is performed, which includes latching an input V1 of a latch circuit consisting of the first PMOS transistor M3 and the third NMOS transistor M5, and pre-charging a voltage V1 of the drain of the second NMOS transistor M1 to VDD.

At operation 3, a sensing operation is performed, which includes adjusting $V_{CSL0}$ to H and adjusting $V_{CSL}$ to H, i.e., $V_{CSL0}$=H, $V_{CSL}$=H.

After $V_{CSL0}$ is adjusted to H and $V_{CSL}$ is adjusted to H, V1=VDD*(R2/(R1+R2)).

At this time, if V1>VDD/2, the output terminal Vout of the reverse output circuit INV1 outputs a low level signal, i.e., Vout=L, it indicates that R2>r11. In this case, it can be determined that the resistance value range of the equivalent resistor R2 corresponding to the TSV to be tested is R2>r11.

If V1<VDD/2, the output terminal Vout of the reverse output circuit INV1 outputs a high level signal, i.e., Vout=H, it indicates that R2<r11. In this case, continue with operation 4.

At operation 4, Vbias is adjusted, to adjust the resistance value of the equivalent adjustable resistor R1 to r10.

Operation 2 and operation 3 are repeated.

At this time, if V1>VDD/2, the output terminal Vout of the reverse output circuit INV1 outputs a low level signal, i.e., Vout=L, it indicates that R2>r10. In this case, it can be determined that the resistance value range of the equivalent resistor R2 corresponding to the TSV to be tested is r10<R2<r11.

If V1<VDD/2, the output terminal Vout of the reverse output circuit INV1 outputs a high level signal, i.e., Vout=H, it indicates that R2<r10. In this case, continue with operation 5.

At operation 5, Vbias is adjusted, to adjust the resistance value of the equivalent adjustable resistor R1 to r9.

Operation 2 and operation 3 are repeated.

At this time, if V1>VDD/2, the output terminal Vout of the reverse output circuit INV1 outputs a low level signal, i.e., Vout=L, it indicates that R2>r9. In this case, it can be determined that the resistance value range of the equivalent resistor R2 corresponding to the TSV to be tested is r9<R2<r10.

If V1<VDD/2, the output terminal Vout of the reverse output circuit INV1 outputs a high level signal, i.e., Vout=H, it indicates that R2<r9. In this case, it can be determined that the resistance value range of the equivalent resistor R2 corresponding to the TSV to be tested is r8<R2<r9.

In the method for TSV detection according to embodiments of the disclosure, after it is determined that the TSV is open-circuited, the resistance value of the equivalent adjustable resistor is adjusted to at least one preset sampling resistance value, and then the resistance value range of the equivalent resistor corresponding to the TSV to be tested is tested based on the signal output by the output terminal of the reverse output circuit. Each of the at least one sampling resistance value is greater than the maximum resistance value of the equivalent resistor corresponding to the TSV to be tested when the TSV to be tested is normal.

In some embodiments, when it is determined that the TSV to be tested is normal, the resistance value of the equivalent adjustable resistor may be adjusted to at least one preset second sampling resistance value, and then the resistance value range of the equivalent resistor corresponding to the TSV to be tested is determined based on the signal output by the output terminal Vout of the reverse output circuit INV1. Each of the at least one second sampling resistance value is greater than the second resistance value and less than the first resistance value, where the second resistance value is a minimum resistance value of the equivalent resistor corresponding to the TSV to be tested when the TSV to be tested is normal, and the first resistance value is a maximum resistance value of the equivalent resistor corresponding to the TSV to be tested when TSV to be tested is normal.

In a feasible implementation, still with reference to FIG. 5, it is assumed that the resistance value of the equivalent resistor R1 is adjusted to 12 different resistance values, i.e., r0-r11. Resistance values r0, r1, r2, . . . , and r11 increases in turn. r4 is the minimum resistance value of the equivalent resistor corresponding to the TSV to be tested when the TSV to be tested is normal, and r8 is the maximum resistance value of the equivalent resistor corresponding to the TSV to be tested when the TSV to be tested is normal, and the second sampling resistance value may include, for example, r5-r7.

After it is determined that the TSV to be tested is normal, the method for TSV detection further includes the following operations.

At operation 1, Vbias is adjusted, to adjust the resistance value of the equivalent adjustable resistor R1 to r7.

At operation 2, a pre-charging operation is performed, which includes latching an input V1 of a latch circuit consisting of the first PMOS transistor M3 and the third NMOS transistor M5, and pre-charging a voltage V1 of the drain of the second NMOS transistor M1 to VDD.

At operation 3, a sensing operation is performed, which includes adjusting $V_{CSL0}$ to H and adjusting $V_{CSL}$ to H, i.e., $V_{CSL0}$=H, $V_{CSL}$=H.

After $V_{CSL0}$ is adjusted to H and $V_{CSL}$ is adjusted to H, V1=VDD*(R2/(R1+R2)).

At this time, if V1>VDD/2, the output terminal Vout of the reverse output circuit INV1 outputs a low level signal, i.e., Vout=L, it indicates that R2>r7. In this case, it can be determined that the resistance value range of the equivalent resistor R2 corresponding to the TSV to be tested is r7<R2<r8.

If V1<VDD/2, the output terminal Vout of the reverse output circuit INV1 outputs a high level signal, i.e., Vout=H, it indicates that R2<r7. In this case, continue with operation 4.

At operation 4, Vbias is adjusted, to adjust the resistance value of the equivalent adjustable resistor R1 to r6.

Operation 2 and operation 3 are repeated.

At this time, if V1>VDD/2, the output terminal Vout of the reverse output circuit INV1 outputs a low level signal, i.e., Vout=L, it indicates that R2>r6. In this case, it can be determined that the resistance value range of the equivalent resistor R2 corresponding to the TSV to be tested is r6<R2<r7.

If V1<VDD/2, the output terminal Vout of the reverse output circuit INV1 outputs a high level signal, i.e., Vout=H, it indicates that R2<r6. In this case, continue with operation 5.

At operation 5, Vbias is adjusted, to adjust the resistance value of the equivalent adjustable resistor R1 to r5.

Operation 2 and operation 3 are repeated.

At this time, if V1>VDD/2, the output terminal Vout of the reverse output circuit INV1 outputs a low level signal, i.e., Vout=L, it indicates that R2>r5. In this case, it can be determined that the resistance value range of the equivalent resistor R2 corresponding to the TSV to be tested is r5<R2<r6.

If V1<VDD/2, the output terminal Vout of the reverse output circuit INV1 outputs a high level signal, i.e., Vout=H, it indicates that R2<r5. In this case, it can be determined that the resistance value range of the equivalent resistor R2 corresponding to the TSV to be tested is r4<R2<r5.

In the method for TSV detection according to embodiments of the disclosure, after it is determined that the TSV is normal, the resistance value of the equivalent adjustable resistor is adjusted to at least one preset sampling resistance value, and then the resistance value range of the equivalent resistor corresponding to the TSV to be tested is tested based on the signal output by the output terminal of the reverse output circuit. Each of the at least one sampling resistance value is greater than the minimum resistance value of the equivalent resistor corresponding to the TSV to be tested when the TSV to be tested is normal, and less than the maximum resistance value of the equivalent resistor corresponding to the TSV to be tested when the TSV to be tested is normal.

In some embodiments, when it is determined that the TSV to be tested is short-circuited, the resistance value of the equivalent adjustable resistor is adjusted to at least one preset third sampling resistance value, and then the resistance value range of the equivalent resistor corresponding to the TSV to be tested is determined based on the signal output by the output terminal Vout of the reverse output circuit INV1. Each of the at least one third sampling resistance value is less than the minimum resistance value of the equivalent resistor corresponding to the TSV to be tested when the TSV to be tested is normal.

In a feasible implementation, still with reference to FIG. 5, it is assumed that the resistance value of the equivalent resistor R1 is adjusted to 12 different resistance values, i.e., r0-r11. Resistance values r0, r1, r2, . . . , and r11 increases in turn. r4 is the minimum resistance value of the equivalent resistor corresponding to the TSV to be tested when the TSV to be tested is normal, and r8 is the maximum resistance value of the equivalent resistor corresponding to the TSV to be tested when the TSV to be tested is normal, and the third sampling resistance value may include, for example, r0-r3.

After it is determined that the TSV to be tested is short-circuited, the method for TSV detection further includes the following operations.

At operation 1, Vbias is adjusted, to adjust the resistance value of the equivalent adjustable resistor R1 to r3.

At operation 2, a pre-charging operation is performed, which includes latching an input V1 of a latch circuit consisting of the first PMOS transistor M3 and the third NMOS transistor M5, and pre-charging a voltage V1 of the drain of the second NMOS transistor M1 to VDD.

At operation 3, a sensing operation is performed, which includes adjusting $V_{CSL0}$ to H and adjusting $V_{CSL}$ to H, i.e., $V_{CSL0}$=H, $V_{CSL}$=H.

After $V_{CSL0}$ is adjusted to H and $V_{CSL}$ is adjusted to H, V1=VDD*(R2/(R1+R2)).

At this time, if V1>VDD/2, the output terminal Vout of the reverse output circuit INV1 outputs a low level signal, i.e., Vout=L, it indicates that R2>r3. In this case, it can be determined that the resistance value range of the equivalent resistor R2 corresponding to the TSV to be tested is r3<R2<r4.

If V1<VDD/2, the output terminal Vout of the reverse output circuit INV1 outputs a high level signal, i.e., Vout=H, it indicates that R2<r3. In this case, continue with operation 4.

At operation 4, Vbias is adjusted, to adjust the resistance value of the equivalent adjustable resistor R1 to r2.

Operation 2 and operation 3 are repeated.

At this time, if V1>VDD/2, the output terminal Vout of the reverse output circuit INV1 outputs a low level signal, i.e., Vout=L, it indicates that R2>r2. In this case, it can be determined that the resistance value range of the equivalent resistor R2 corresponding to the TSV to be tested is r2<R2<r3.

If V1<VDD/2, the output terminal Vout of the reverse output circuit INV1 outputs a high level signal, i.e., Vout=H, it indicates that R2<r2. In this case, continue with operation 5.

At operation 5, Vbias is adjusted to adjust the resistance value of the equivalent adjustable resistor R1 to r1.

Operation 2 and operation 3 are repeated.

At this time, if V1>VDD/2, the output terminal Vout of the reverse output circuit INV1 outputs a low level signal, i.e., Vout=L, it indicates that R2>r1. In this case, it can be determined that the resistance value range of the equivalent resistor R2 corresponding to the TSV to be tested is r1<R2<r2.

If V1<VDD/2, the output terminal Vout of the reverse output circuit INV1 outputs a high level signal, i.e., Vout=H, it indicates that R2<r1. In this case, continue with operation 6.

At operation 6, Vbias is adjusted, to adjust the resistance value of the equivalent adjustable resistor R1 to r0.

Operation 2 and operation 3 are repeated.

At this time, if V1>VDD/2, the output terminal Vout of the reverse output circuit INV1 outputs a low level signal, i.e., Vout=L, it indicates that R2>r0. In this case, it can be determined that the resistance value range of the equivalent resistor R2 corresponding to the TSV to be tested is r0<R2<r1.

If V1<VDD/2, the output terminal Vout of the reverse output circuit INV1 outputs a high level signal, i.e., Vout=H, it indicates that R2<r0. In this case, it can be determined that the resistance value range of the equivalent resistor R2 corresponding to the TSV to be tested is R2<r0.

In the method for TSV detection according to embodiments of the disclosure, after it is determined that the TSV is short-circuited, the resistance value of the equivalent adjustable resistor is adjusted to at least one preset sampling resistance value, and then the resistance value range of the equivalent resistor corresponding to the TSV to be tested is tested based on the signal output by the output terminal of the reverse output circuit. The sampling resistance value is greater than the minimum resistance value of the equivalent resistor corresponding to the TSV to be tested when the TSV to be tested is normal.

In the several embodiments provided in the disclosure, it should be understood that the disclosed circuit and method may be implemented in other manners. For example, the described embodiments are merely exemplary. For example, the division of the circuit modules is merely a division in logical functions and may be realized in other manners in actual implementation. For example, multiple modules may be combined or integrated into another system, or some features/feature may be omitted or skipped.

It can understand by persons of ordinary skill in the art that all or part of the operations for implementing the foregoing method embodiments can be completed by hardware associated with program instructions. The program can be stored in a computer readable storage medium. The program, when is executed, performs the operations included in the foregoing method embodiments, and the storage medium includes a ROM, a RAM, a floppy disk, or an optical disk and other media that can store program codes.

Finally, it should be noted that the foregoing embodiments are merely intended to illustrate the technical solutions of the disclosure, but not to limit them. Although the disclosure is described in detail with reference to the foregoing embodiments, it should be understood by persons of ordinary skill in the art that it is still possible to modify the technical solutions recited in the foregoing embodiments, or to make equivalent replacements on part or all of the technical features thereof. Moreover, these modifications or replacements do not take the essence of the corresponding technical solutions out of the scope of the technical solutions of embodiments of the disclosure.

What is claimed is:

1. A method for through silicon via detection, applied to a circuit for through silicon via detection, the circuit for through silicon via detection comprising a through silicon via to be tested, an equivalent adjustable resistor, and a reverse output circuit, a first terminal of the through silicon via to be tested being connected to a second terminal of the equivalent adjustable resistor, a second terminal of the through silicon via to be tested being grounded, and an input terminal of the reverse output circuit being connected to the first terminal of the through silicon via to be tested; the method comprising:
    adjusting a resistance value of the equivalent adjustable resistor to a preset first resistance value, and keeping a voltage of a first terminal of the equivalent adjustable resistor at a preset voltage value, wherein the first resistance value is a maximum resistance value of an equivalent resistor corresponding to the through silicon via to be tested when the through silicon via to be tested is normal; and
    determining whether the through silicon via to be tested is defective based on a signal output by an output terminal of the reverse output circuit, wherein
    in response to a voltage of the first terminal of the through silicon via to be tested being greater than half of the preset voltage value, the output terminal of the reverse output circuit outputs a low level signal, and
    in response to the voltage of the first terminal of the through silicon via to be tested being less than half of the preset voltage value, the output terminal of the reverse output circuit outputs a high level signal.

2. The method of claim 1, wherein determining whether the through silicon via to be tested is defective based on the signal output by the output terminal of the reverse output circuit comprises:
    in response to the output terminal of the reverse output circuit outputting the low level signal, determining that the through silicon via to be tested is open-circuited.

3. The method of claim 1, wherein determining whether the through silicon via to be tested is defective based on the signal output by the output terminal of the reverse output circuit comprises:
    in response to the output terminal of the reverse output circuit outputting the high level signal, adjusting the resistance value of the equivalent adjustable resistor to a preset second resistance value, wherein the second resistance value is a minimum resistance value of the equivalent resistor corresponding to the through silicon via to be tested when the through silicon via to be tested is normal;
    in response to the output terminal of the reverse output circuit outputting the low level signal after the resistance value of the equivalent adjustable resistor is adjusted to the preset second resistance value, determining that the through silicon via to be tested is normal; and
    in response to the output terminal of the reverse output circuit outputting the high level signal after the resistance value of the equivalent adjustable resistor is adjusted to the preset second resistance value, determining that the through silicon via to be tested is short-circuited.

4. The method of claim 2, further comprising: after determining that the through silicon via to be tested is open-circuited,
    adjusting the resistance value of the equivalent adjustable resistor to at least one preset first sampling resistance value, wherein each of the at least one first sampling resistance value is greater than the first resistance value; and
    determining a resistance value range of the equivalent resistor corresponding to the through silicon via to be tested based on the signal output by the output terminal of the reverse output circuit.

5. The method of claim 3, further comprising: after determining that the through silicon via to be tested is normal, adjusting the resistance value of the equivalent adjustable resistor to at least one preset second sampling resistance value, wherein each of the at least one second sampling resistance value is greater than the second resistance value and less than the first resistance value; and determining a resistance value range of the equivalent resistor corresponding to the through silicon via to be tested based on the signal output by the output terminal of the reverse output circuit.

6. The method of claim 3, further comprising: after determining that the through silicon via to be tested is short-circuited, adjusting the resistance value of the equivalent adjustable resistor to at least one preset third sampling resistance value, wherein each of the at least one third sampling resistance value is less than the second resistance value; and determining a resistance value range of the equivalent resistor corresponding to the through silicon via to be tested based on the signal output by the output terminal of the reverse output circuit.

7. The method of claim 1, wherein the through silicon via detection circuit further comprises a first switch circuit and a second switch circuit, the first terminal of the through silicon via to be tested is connected to the second terminal of the equivalent adjustable resistor through the second switch circuit, the second terminal of the through silicon via to be tested is grounded through the first switch circuit, a first terminal of the first switch circuit is grounded, a second terminal of the first switch circuit is connected to the second terminal of the through silicon via to be tested, a first terminal of the second switch circuit is connected to the first terminal of the through silicon via to be tested, and a second terminal of the second switch circuit is connected to the second terminal of the equivalent adjustable resistor, wherein the method further comprises: after keeping the voltage of the first terminal of the equivalent adjustable resistor at the preset voltage value, turning on the first switch circuit and the second switch circuit.

8. The method of claim 7, wherein the first switch circuit comprises a first negative channel metal oxide semiconductor (NMOS) transistor, and the second switch circuit comprises a second NMOS transistor, wherein a source of the first NMOS transistor is grounded, a drain of the first NMOS transistor is connected to the second terminal of the through silicon via to be tested, a source of the second NMOS transistor is connected to the first terminal of the through silicon via to be tested, and a drain of the second NMOS transistor is connected to the second terminal of the equivalent adjustable resistor;

wherein turning on the first switch circuit and the second switch circuit comprises:

adjusting a gate voltage of the first NMOS transistor and a gate voltage of the second NMOS transistor to a high level, to turn on the first NMOS transistor and the second NMOS transistor.

9. The method of claim 1, wherein the through silicon via detection circuit further comprises a latch circuit and a pre-charging circuit, wherein the latch circuit comprises a first positive channel metal oxide semiconductor (PMOS) transistor and a third negative channel metal oxide semiconductor (NMOS) transistor, a source of the first PMOS transistor is connected to a preset power supply, a drain of the first PMOS transistor is connected to the first terminal of the equivalent adjustable resistor, a gate of the first PMOS transistor is connected to the output terminal of the reverse output circuit, an output voltage of the preset power supply is the preset voltage value, a source of the third NMOS transistor is grounded, a drain of the third NMOS transistor is connected to the second terminal of the equivalent adjustable resistor, a gate of the third NMOS transistor is connected to the output terminal of the reverse output circuit, and the pre-charging circuit is connected to the first terminal of the through silicon via to be tested;

wherein keeping the voltage of the first terminal of the equivalent adjustable resistor at the preset voltage value comprises:

adjusting, through the pre-charging circuit, the voltage of the first terminal of the through silicon via to be tested to the preset voltage value.

10. The method of claim 9, wherein the pre-charging circuit comprises a second PMOS transistor, a source of the second PMOS transistor is connected to the preset power supply, a drain of the second PMOS transistor is connected to the first terminal of the through silicon via to be tested, and a gate of the second PMOS transistor is provided with a pre-charging control signal.

11. The method of claim 9, wherein the equivalent adjustable resistor comprises a third PMOS transistor, a source of the third PMOS transistor is connected to the drain of the first PMOS transistor, and a drain of the third PMOS transistor is connected to the first terminal of the through silicon via to be tested, wherein adjusting the resistance value of the equivalent adjustable resistor to the preset first resistance value comprises:

adjusting a gate voltage of the third PMOS transistor, to set an equivalent resistance value of the third PMOS transistor to be equal to the first resistance value.

12. A circuit for through silicon via detection, comprising a through silicon via to be tested, an equivalent adjustable resistor, and a reverse output circuit, wherein a first terminal of the through silicon via to be tested is connected to a second terminal of the equivalent adjustable resistor, a second terminal of the through silicon via to be tested is grounded, and an input terminal of the reverse output circuit is connected to the first terminal of the through silicon via to be tested;

a lower limit value of a resistance value of the equivalent adjustable resistor is less than a first resistance value, an upper limit value of the resistance value of the equivalent adjustable resistor is greater than a second resistance value, the first resistance value is a minimum resistance value of an equivalent resistor corresponding to the through silicon via to be tested when the through silicon via to be tested is normal, and the second resistance value is a maximum resistance value of the equivalent resistor corresponding to the through silicon via to be tested when the through silicon via to be tested is normal; and the reverse output circuit is used for outputting a low level signal or a high level signal based on a voltage of the first terminal of the through silicon via to be tested; wherein in response to a voltage of a first terminal of the equivalent adjustable resistor being kept at a preset voltage value, and the voltage of the first terminal of the through silicon via to be tested being greater than half of the preset voltage value, the reverse output circuit outputs a low level signal; and in response to the voltage of the first terminal of the equivalent adjustable resistor being kept at the preset voltage value, and the voltage of the first terminal of the through silicon via to be tested being less than half of the preset voltage value, the reverse output circuit outputs a high level signal.

13. The circuit for through silicon via detection of claim 12, wherein the through silicon via detection circuit further comprises a first switch circuit and a second switch circuit, a first terminal of the first switch circuit is grounded, a second terminal of the first switch circuit is connected to the second terminal of the through silicon via to be tested, a first terminal of the second switch circuit is connected to the first terminal of the through silicon via to be tested, and a second terminal of the second switch circuit is connected to the second terminal of the equivalent adjustable resistor.

14. The circuit for through silicon via detection of claim 13, wherein the first switch circuit comprises a first negative channel metal oxide semiconductor (NMOS) transistor, and the second switch circuit comprises a second NMOS transistor, and wherein a source of the first NMOS transistor is grounded, a drain of the first NMOS transistor is connected to the second terminal of the through silicon via to be tested, a source of the second NMOS transistor is connected to the first terminal of the through silicon via to be tested, and a drain of the second NMOS transistor is connected to the second terminal of the equivalent adjustable resistor, in response to a gate voltage of the first NMOS transistor and a gate voltage of the second NMOS transistor being at a high level, the first NMOS transistor and the second NMOS transistor are turned on.

15. The circuit for through silicon via detection of claim 12, further comprising: a latch circuit and a pre-charging circuit, wherein the latch circuit comprises a first positive channel metal oxide semiconductor (PMOS) transistor and a third negative channel metal oxide semiconductor (NMOS) transistor, a source of the first PMOS transistor is connected to a preset power supply, a drain of the first PMOS transistor is connected to a first terminal of the equivalent adjustable resistor, a gate of the first PMOS transistor is connected to the output terminal of the reverse output circuit, an output voltage of the preset power supply is a preset voltage value, a source of the third NMOS transistor is grounded, a drain of the third NMOS transistor is connected to the second terminal of the equivalent adjustable resistor, a gate of the third NMOS transistor is connected to the output terminal of the reverse output circuit, and the pre-charging circuit is connected to the first terminal of the through silicon via to be tested.

16. The circuit for through silicon via detection of claim 15, wherein the pre-charging circuit comprises a second PMOS transistor, a source of the second PMOS transistor is connected to the preset power supply, a drain of the second PMOS transistor is connected to the first terminal of the through silicon via to be tested, and a gate of the second PMOS transistor is provided with a pre-charging control signal.

17. The circuit for through silicon via detection of claim 15, wherein the equivalent adjustable resistor comprises a third PMOS transistor, a source of the third PMOS transistor is connected to the drain of the first PMOS transistor, a drain of the third PMOS transistor is connected to the first terminal of the through silicon via to be tested, and a gate of the third PMOS transistor is connected to a voltage adjustable power supply.

* * * * *